United States Patent
Jeon et al.

(10) Patent No.: US 12,034,202 B2
(45) Date of Patent: Jul. 9, 2024

(54) ANTENNA STRUCTURE AND ELECTRONIC DEVICE INCLUDING THE SAME

(71) Applicant: SAMSUNG ELECTRONICS CO., LTD., Suwon-si (KR)

(72) Inventors: Sinhyung Jeon, Suwon-si (KR); Soohyun Seo, Suwon-si (KR); Jongwan Shim, Suwon-si (KR); Minwoo Yoo, Suwon-si (KR); Byounguk Yoon, Suwon-si (KR); Jongchul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 329 days.

(21) Appl. No.: 17/531,452

(22) Filed: Nov. 19, 2021

(65) Prior Publication Data

US 2022/0158331 A1    May 19, 2022

Related U.S. Application Data

(63) Continuation of application No. PCT/KR2021/016991, filed on Nov. 18, 2021.

(30) Foreign Application Priority Data

Nov. 19, 2020  (KR) ............ 10-2020-0155520
Apr. 19, 2021  (KR) ............ 10-2021-0050710

(51) Int. Cl.
*H01Q 1/24*   (2006.01)
*H01Q 1/52*   (2006.01)
(Continued)

(52) U.S. Cl.
CPC ............ *H01Q 1/243* (2013.01); *H01Q 1/52* (2013.01); *H01Q 5/307* (2015.01); *H04M 1/0268* (2013.01); *H05K 9/005* (2013.01)

(58) Field of Classification Search
CPC ...... H01Q 1/22; H01Q 1/2258; H01Q 1/2266; H01Q 1/243; H01Q 1/38; H01Q 1/52;
(Continued)

(56) References Cited

U.S. PATENT DOCUMENTS

2015/0002389 A1   1/2015   Lefebvre et al.
2016/0187929 A1   6/2016   Kim et al.
(Continued)

FOREIGN PATENT DOCUMENTS

EP         3318953        3/2020
KR      10-1570869       11/2015
(Continued)

OTHER PUBLICATIONS

International Search Report and Written Opinion dated Mar. 2, 2022 in corresponding International Application No. PCT/KR2021/016991.

*Primary Examiner* — Robert Karacsony
(74) *Attorney, Agent, or Firm* — Nixon & Vanderhye, P.C.

(57) ABSTRACT

According to various embodiments of the disclosure, an electronic device may include: a housing, a rollable display, a shielding case disposed inside the housing and surrounding at least a part of the rollable display, and including a first opening accommodating the rollable display, and a first antenna structure including at least one antenna disposed in an area outside the shielding case.

15 Claims, 11 Drawing Sheets

(51) Int. Cl.
*H01Q 5/307* (2015.01)
*H04M 1/02* (2006.01)
*H05K 9/00* (2006.01)

(58) Field of Classification Search
CPC .......... H01Q 5/307; H01Q 9/065; H01Q 9/42; H01Q 21/28; H05K 9/005; H04M 1/0268; G06F 1/1652; G06F 1/1656; G06F 1/1698
See application file for complete search history.

(56) References Cited

U.S. PATENT DOCUMENTS

| | | | |
|---|---|---|---|
| 2017/0142241 A1 | 5/2017 | Kim et al. | |
| 2017/0212607 A1* | 7/2017 | Yoon | G06F 3/147 |
| 2018/0348881 A1 | 12/2018 | Chung | |
| 2020/0371558 A1 | 11/2020 | Kim et al. | |

FOREIGN PATENT DOCUMENTS

| | | |
|---|---|---|
| KR | 10-2016-0081786 | 7/2016 |
| KR | 10-2017-0056292 | 5/2017 |
| KR | 10-2019-0086305 | 7/2019 |
| WO | 2017/094926 | 6/2017 |

\* cited by examiner

ANTENNA STRUCTURE AND ELECTRONIC DEVICE INCLUDING THE SAME

CROSS-REFERENCE TO RELATED APPLICATIONS

This application is a continuation of International Application No. PCT/KR2021/016991 designating the United States, filed on Nov. 18, 2021, in the Korean Intellectual Property Receiving Office and claiming priority to Korean Patent Application No. 10-2020-0155520, filed on Nov. 19, 2020, in the Korean Intellectual Property Office and Korean Patent Application No. 10-2021-0050710, filed on Apr. 19, 2021, in the Korean Intellectual Property Office, the disclosures of all of which are incorporated by reference herein in their entireties.

BACKGROUND

Field

The disclosure relates to an antenna structure and an electronic device including the same.

Description of Related Art

Along with the development of electronics, information, and communication technologies, various functions are being integrated into one portable communication device or electronic device. For example, a smart phone includes the function of a multimedia player, an imaging device, or an electronic notebook as well as a communication function, and other functions may be implemented in the smart phone through installation of additional applications.

As personal or portable electronic devices such as smart phones have been widely used, user demands for portability and ease of use are increasing. For example, a touch screen display may provide a screen, for example, a virtual keypad which serves as an output device outputting visual information and substitutes for a mechanical input device (e.g., a button-type keypad). Accordingly, the portable communication device or electronic device may provide the same or improved usability (e.g., a larger screen), while being miniaturized. On the other hand, it is expected that commercialization of flexible displays, for example, foldable or rollable displays will further improve the portability and ease of use of electronic devices in the future.

In an electronic device including a rollable display extendable by a rolling operation, the distance between the rollable display and an antenna structure may be different depending on a degree to which the rollable display is wound or unwound. For the antenna structure, the rollable display may act as a kind of conductor that affects antenna performance (e.g. causes interference). Accordingly, a change in the distance between the rollable display and the antenna structure may adversely affect the antenna radiation performance of the antenna structure.

SUMMARY

Embodiments of the disclosure provide a structure for shielding the surroundings of a rollable display in an electronic device wherein electromagnetic interference between the antenna structure and the rollable display may be canceled and/or reduced and antenna performance may be kept constant.

According to various example embodiments of the disclosure, an electronic device may include: a housing, a rollable display, a shielding case disposed inside the housing and surrounding at least a part of the rollable display and including a first opening formed therein for movement of the rollable display, and a first antenna structure including at least one antenna disposed in an area outside the shielding case.

According to various example embodiments of the disclosure, an electronic device may include: a housing, a rollable display, a shielding case disposed inside the housing and surrounding at least a part of the rollable display, a first antenna structure including at least one antenna disposed in an area outside the shielding case, and a second antenna structure including at least one antenna disposed in an area inside the housing and at least partially facing the first antenna structure.

An electronic device according to various example embodiments may include a rollable display accommodated in or extendably withdrawn from a housing and includes an antenna structure with antenna performance kept constant during accommodation or withdrawal of the rollable display.

As an electronic device according to various example embodiments may include a shielding case for shielding a rollable display from an antenna structure, the performance of the antenna structure may be increased.

An electronic device according to various example embodiments may increase antenna bandwidth performance by an antenna structure additionally disposed in an area of a shielding case for shielding a rollable display from the antenna structure.

An electronic device according to various example embodiments may increase antenna radiation performance without increasing a mounting space through patterning of additional antenna structures in various manners in an area of the shielding case for shielding the rollable display from the antenna structures.

It will be appreciated by persons skilled in the art that the effects that can be achieved with the disclosure are not limited to what has been particularly described hereinabove and other effects of the disclosure will be more clearly understood from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
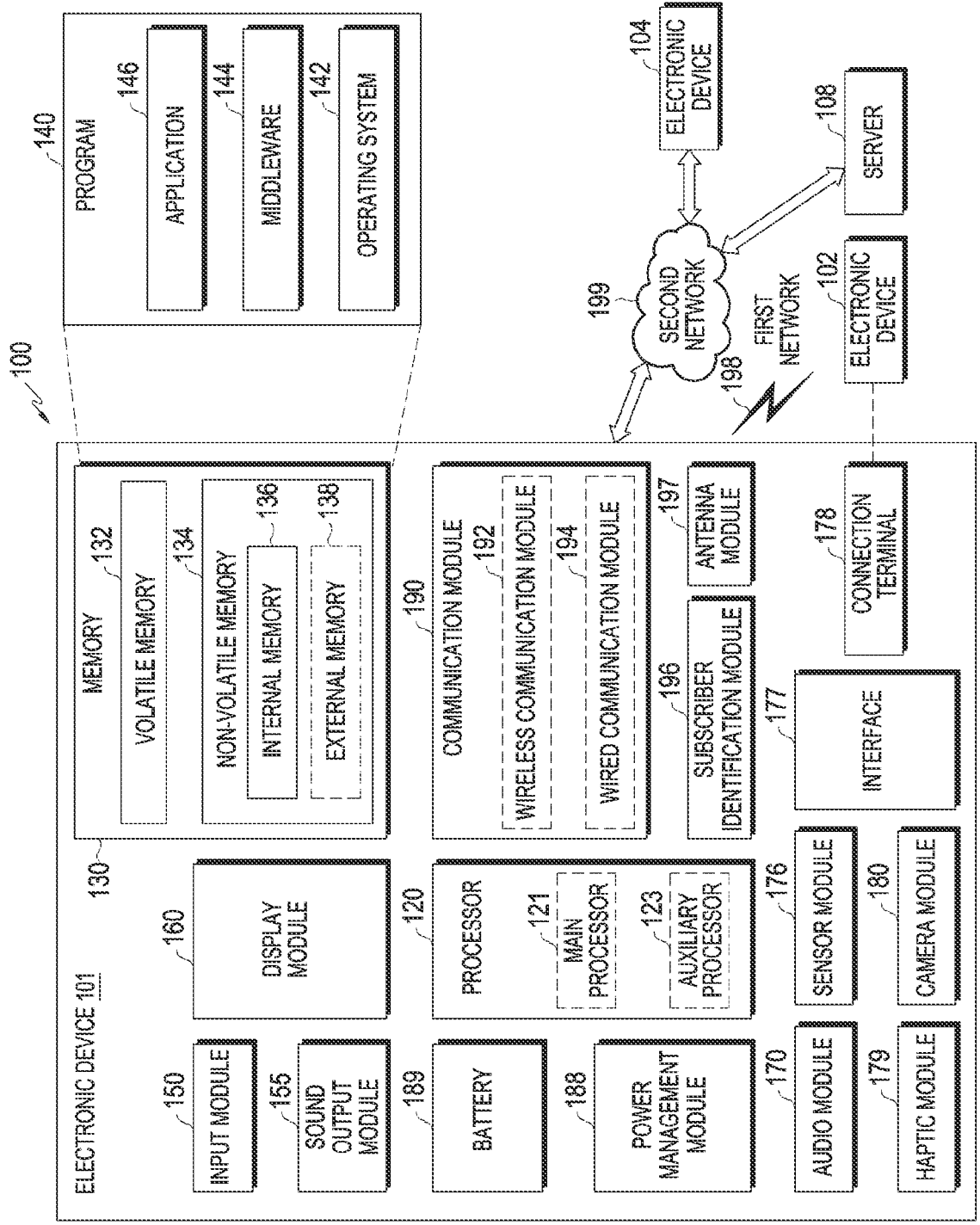
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

An electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
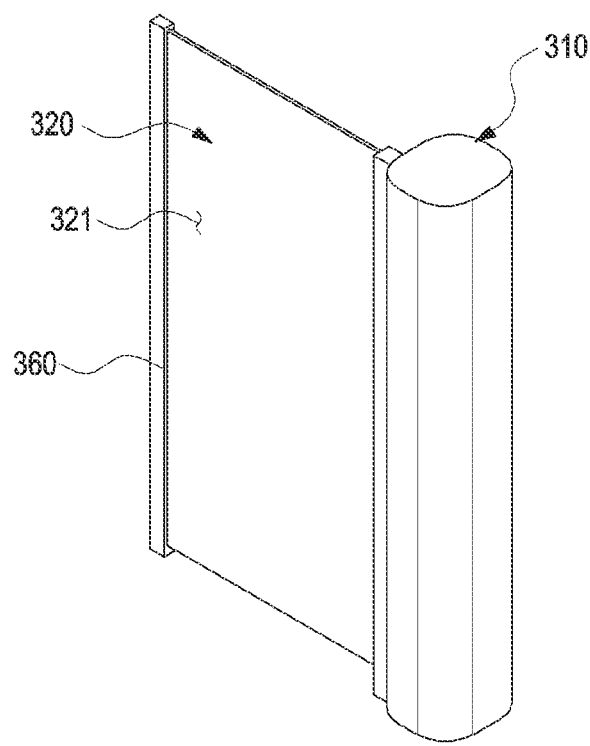
FIG. 2 is a perspective view illustrating an electronic device according to various embodiments.

FIG. 2 is a perspective view illustrating an electronic device according to various embodiments.

Figure 3:
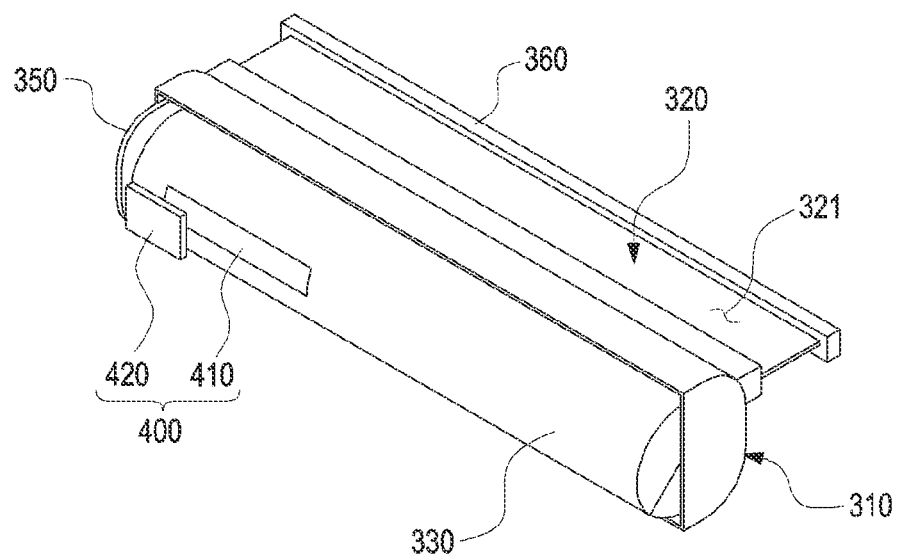
FIG. 3 is a perspective view illustrating an electronic device shown without a part of a housing to indicate the positions of internal components of the electronic device according to various embodiments.

FIG. 3 is a perspective view illustrating an electronic device shown without a part of a housing to indicate the positions of internal components of the electronic device according to various embodiments.

Figure 4:
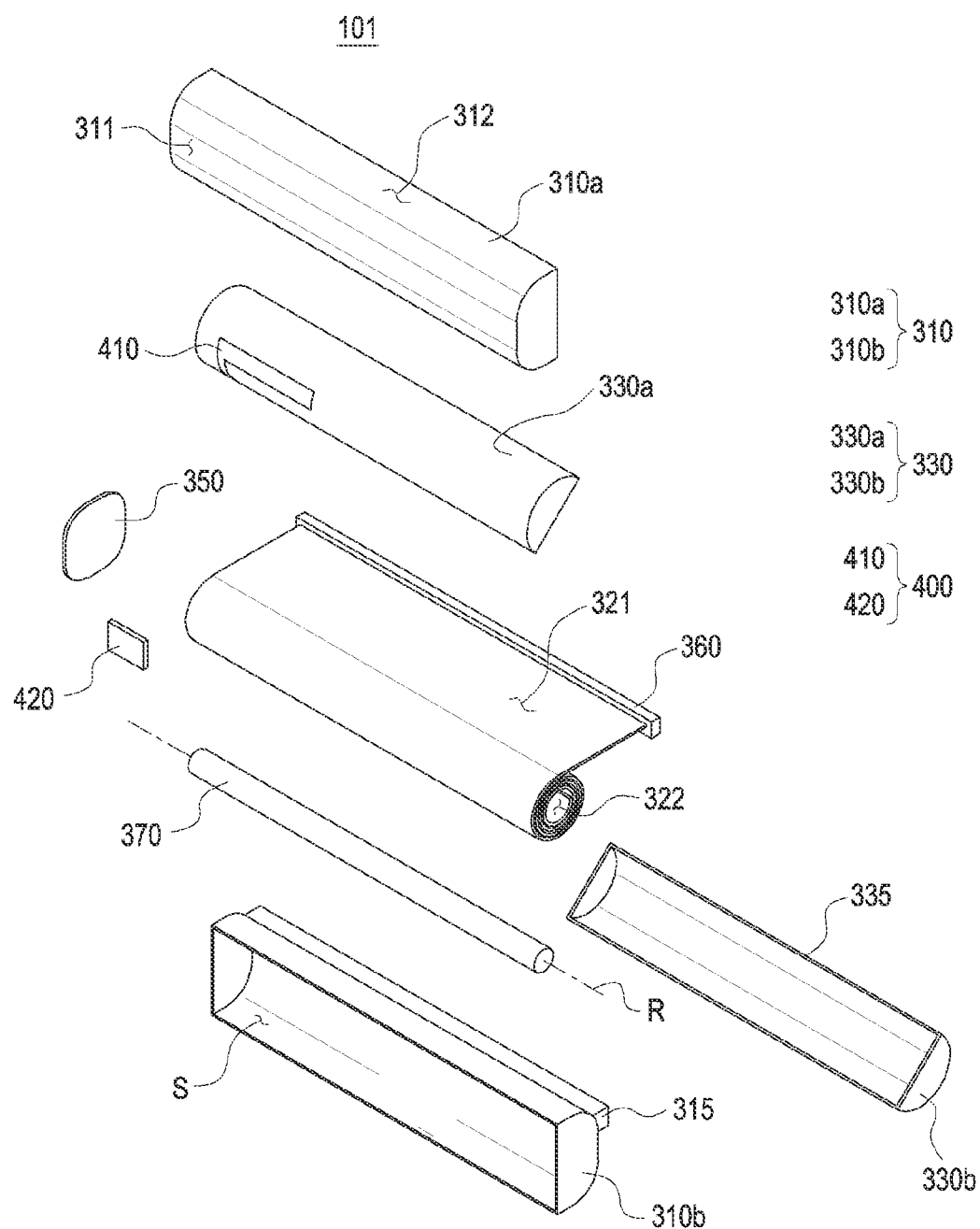
FIG. 4 is an exploded perspective view illustrating an electronic device according to various embodiments

FIG. 4 is an exploded perspective view illustrating an electronic device according to various embodiments.

An electronic device (e.g., the electronic device 101 of FIG. 1) according to various embodiments of the disclosure may include a housing 310, a rollable display 320 at least partially accommodated (or received) in the housing 310, a shielding case 330 formed to surround at least a part of the rollable display 320, and an antenna structure 400 (e.g., a first antenna structure 410 and a second antenna structure 420) disposed in (or adjacent to) an area of the housing 310 and/or the shielding case 330.

FIGS. 2 and 3 may illustrate a state in which at least a part of the rollable display 320 has been extended from the housing 310 of the electronic device 101. For example, in FIGS. 2 and 3, the state in which the rollable display 320 has been extended from the housing 310 may include a state in which a part of the rollable display 320 is exposed to the outside of the housing 310, while the other part of the rollable display 320 is accommodated inside the housing 310. In another example, the state in which the rollable display 320 has been extended from the housing 310 may include a state in which at least a part of the rollable display 320 is rolled (or wound) and the rolled part is at least partially accommodated inside the housing 310.

According to various embodiments, the rollable display 320 may be accommodated in the housing 310 by a slide-in operation into the housing 310 or exposed by a slid-out operation from the housing 310. According to an embodiment, the entire rollable display 320 may be accommodated in the housing 310 in a state where as much of the rollable display 320 as possible is accommodated in the housing 310. According to an embodiment, at least a part of the rollable display 320 may be exposed to the outside of the housing 310, while as much of the rollable display 320 as possible is accommodated in the housing 310.

According to various embodiments, the housing 310 may accommodate various electrical and electronic components such as a main circuit board (e.g., a printed circuit board 350) or a battery 370 in an internal space S. For example, a processor (e.g., a central processing unit, a graphics processing unit, an image signal processor, and so on) for displaying a screen on the rollable display 320 or a pressure sensor for detecting a touch input or the intensity of a touch may be accommodated inside the housing 310. In addition, for example, a component such as a camera module, and a sensor module such as a gesture sensor, a gyro sensor, a barometric pressure sensor, a magnetic sensor, an acceleration sensor, a grip sensor, a color sensor, an IR sensor, a biometric sensor, a temperature sensor, a humidity sensor, or an illuminance sensor may be included inside the housing 310.

According to various embodiments, the housing 310 may include a front housing 310a including a flat part 311 and a curved part 312, and a rear housing 310b coupled with the front housing 310a to form the internal space S and having a shape corresponding to that of the front housing 310a. According to an embodiment, the front housing 310a and the rear housing 310b may be integrally formed. According to an embodiment, the housing 310 may include other components (e.g., a bracket) in addition to the front housing 310a and the rear housing 310b.

According to an embodiment, the housing 310 (e.g., the front housing 310a and/or the rear housing 310b) may include the flat part 311 and the curved part 312. For example, the housing 310 may include the flat part 311 facing a first direction and the curved part 312 having a shape corresponding to a curved (e.g., bent or rolled) part of the rollable display 320 and extending from the flat part 311. The curved part 312 may seamlessly extend from the flat part 311.

According to an embodiment, an opening (e.g., a second opening 315) may be formed on one surface (e.g., the rear housing 310b) of the housing 310, for accommodating or withdrawing the rollable display 320 therethrough. At least a part (e.g., a first area 321) of the rollable display 320 may pass through the second opening 315 to be received in the inner space of the housing 310 by the slide-in operation and withdrawn from the housing 310 by the slide-out operation.

According to various embodiments, the rollable display 320 may be coupled with or disposed adjacent to a touch sensing circuit, a pressure sensor that may measure the intensity (pressure) of a touch, and/or a digitizer that detects a magnetic field-type stylus pen. Accordingly, when a user touches the surface of an area of the rollable display 320, which is exposed to the outside of the housing 310, the rollable display 320 may receive a corresponding touch input.

According to an embodiment, the rollable display 320 may include the first area 321 and a second area 322 which extends from the first area 321 and is at least partially bent. The at least bent part may refer to a part of the second area 322 in a rolled shape accommodated in the housing 310. According to an embodiment, at least a part of the first area 321 of the rollable display 320 may be exposed to the outside of the housing 310, and the second area 322 of the rollable display 320 may extend from the first area 321 and may be rolled around a guide member (e.g., the battery 370) and have a curved shape.

According to an embodiment, a support member (e.g., a support) 360 may be disposed at one end of the rollable display 320. When the rollable display 320 is withdrawn and extended to the outside, the support member 360 may guide the rollable display 320 so that the rollable display 320 provides a flat surface. As the support member 360 moves away from the housing 310, the first area 321, which is an area of the rollable display 320 exposed to the outside of the housing 310, may extend. According to an embodiment, when the housing 310 and the support member 360 move away from each other in a state in which at least a part of the first area 321 of the rollable display 320 is wound, the rollable display 320 may extend in one direction (one way) and/or in both directions (two ways).

According to an embodiment, the rollable display 320 may include a display panel which is at least partially bendable, and a window member which forms the exterior of the display. Although the rollable display 320 may include other components such as a touch panel including a polarization layer that allows only light in a specific wavelength out of light incident on a screen displayed on the display panel or on the display panel to pass, a touch sensing circuit, and a pressure sensor for measuring the intensity (pressure) of a touch, a magnetic shielding member for blocking noise, and a protection member for absorbing a physical impact applied to the panel, the components will not be described herein, for convenience of description.

According to an embodiment, the display panel may include a display element layer including at least one pixel and a thin film transistor (TFT) layer coupled to the display element layer. According to various embodiments, the display panel may correspond to a panel such as a liquid crystal display (LCD) panel, a light emitting diode (LED) panel, or an active matrix organic light emitting diode (AMOLED) panel, and display various images according to various operating states, application execution, and content of the electronic device 101. According to an embodiment, the display panel may be coupled with the touch panel or disposed adjacent to the top surface or bottom surface of the touch panel. The electronic device 101 may detect an input on the surface of the display using the display panel. Inputs recognizable by the display panel may include a hovering input as well as a direct touch input.

In various embodiments, at least a part of the window member may be formed of a substantially transparent material. For example, the window member may be formed of a glass plate or polymer plate including various coating layers. According to an embodiment, the display panel may be visually exposed through a substantial portion of the window member.

According to an embodiment, the window member may be implemented with foldable thin glass (FTG) which is foldable and very thin (e.g., with a thickness of about 100 μm or less). The window member may be formed in correspondence with the size and shape of the electronic device 101 or the rollable display 320, generally using a laser cutting device or a computer numerical control (CNC) machining device.

According to various embodiments, the electronic device 101 may further include the shielding case 330 surrounding at least a part of the rollable display 320 and having an opening (e.g., a first opening 335) formed therein, for movement of the rollable display 320. The shielding case 330 may include a front case 330a including a curved portion, and a rear case 330b coupled with the front case 330a to form an accommodating space for the rollable display 320 (and the battery 370) and having a shape corresponding to that of the front case 330a. According to an embodiment, the front case 330a and the rear case 330b may be integrally formed.

According to an embodiment, the first opening 335 for accommodating or withdrawing the rollable display 320 therethrough may be formed on one surface (e.g., the rear case 330b) of the shielding case 330. The first opening 335 of the shielding case 330 may be disposed in parallel to the second opening 315 of the housing 310, facing the second opening 315, and at least a part (e.g., the first area 321) of the rollable display 320 may pass through the first opening 335 to be accommodated in the inner space of the shielding case 330 by a slide-in operation or withdrawn to the outside of the shielding case 330 by a slide-out operation.

According to an embodiment, the shielding case 330 may designed of a shielding material to limit an electromagnetic effect generated with the antenna structure 400 of the electronic device 101. For example, at least a part of the shielding case 330 may include a conductive material. In another example, at least a part of the shielding case 330 may include at least one of steel use stainless (SUS), conductive fiber, metal foil, a conductive gasket, or a wire. In another example, at least a part of the shielding case 330 may include a conductive material, and another part thereof may include a non-conductive material. The non-conductive material may be coated on the outer surface of the structure formed of the conductive material, or the conductive material may be coated on the outer surface of the structure formed of the non-conductive material. In general, a rollable display sliding in and sliding out by rolling may have a different distance from the antenna structure 400 by the rolling operation. The rollable display may serve as a kind of conductor for the antenna structure 400, and accordingly, the rolling operation may change (e.g., deteriorate) antenna performance, thereby adversely affecting antenna radiation. As the shielding case 330 of the electronic device 101 according to the disclosure shields the rollable display 320 from the antenna structure 400, the shielding case 330 may limit an effect (e.g., interference) on the antenna structure 400 and prevent and/or reduce degradation of antenna radiation performance.

According to various embodiments, the battery 370 may be disposed inside the shielding case 330. The battery 370 is a device for supplying power to at least one component of the electronic device 101, and may include, for example, a non-rechargeable primary battery, a rechargeable secondary battery, or a fuel cell. According to an embodiment, the battery 370 may be integrally disposed inside the electronic device 101 or may be disposed detachably from the electronic device 101. For example, the battery 370 may be designed into a cylinder, and may be rotatably mounted on one edge of the shielding case 330 so that the rollable display 320 may be wound round the battery 370. According to an embodiment, the battery 370 may guide rotation of the rollable display 320 while rotating around a rotation axis R.

According to various embodiments, the printed circuit board 350 may be disposed inside the housing 310. For example, the printed circuit board 350 may be disposed between the shielding case 330 and the housing 310, and a processor, a memory, and/or an interface may be mounted on the circuit board 350. The processor may include, for example, at least one of a central processing unit, an application processor, a graphics processing unit, an image signal processor, a sensor hub processor, or a communication processor. According to various embodiments, the printed circuit board 350 may include a flexible printed circuit board type radio frequency cable (FRC). For example, the printed circuit board 350 may be electrically coupled to an antenna module (e.g., the antenna module 197 of FIG. 1) and a communication module (e.g., the communication module 190 of FIG. 1).

According to an embodiment, the memory may include, for example, a volatile memory or a non-volatile memory.

According to an embodiment, the interface may include, for example, a high definition multimedia interface (HDMI), a universal serial bus (USB) interface, a secure digital (SD) card interface, and/or an audio interface. The interface may, for example, electrically or physically couple the electronic device 101 to an external electronic device and include a USB connector, an SD card/multimedia card (MMC) connector, or an audio connector.

According to various embodiments, the antenna structure 400 (e.g., the first antenna structure 410, and/or the second antenna structure 420) may be disposed between the shielding case 330 and the housing 310. The antenna structure 420 may include, for example, and without limitation, a near field communication (NFC) antenna, a wireless charging antenna, and/or a magnetic secure transmission (MST) antenna. The antenna structure 420 may, for example, perform short-range communication with an external device or wirelessly transmit and receive power required for charging. In another example, the antenna structure 420 may include an antenna for a 5th generation (5G) network after a 4th generation (4G) network, and a next-generation communication technology.

According to various embodiments, while not shown, the electronic device 101 may further include an input device, a connector hole, an audio module, and/or a camera module. The electronic device 101 may further include an indicator (e.g., an LED device) or various sensor modules. The configuration of the audio module and/or the camera module may be wholly or partially identical to that of the audio module 170 and/or the camera module 180 of FIG. 1.

According to an embodiment, because the part of the rollable display 320 accommodated in the housing 310 is blocked by the housing 310, it may be difficult for the part of the rollable display 320 to receive a user touch input. To receive a touch input, the electronic device 101 may include an input device (not shown). The input device may be provided in the form of, for example, a button or a key and formed on the flat part 311 and/or the curved part 312 of the housing 310. In another example, the user may manipulate the display slide-in or slide-out operation of the electronic device 101 or apply various user inputs such as display screen on/off, display screen switching, application channel switching, volume control, and channel control by touching the input device.

Figure 5:
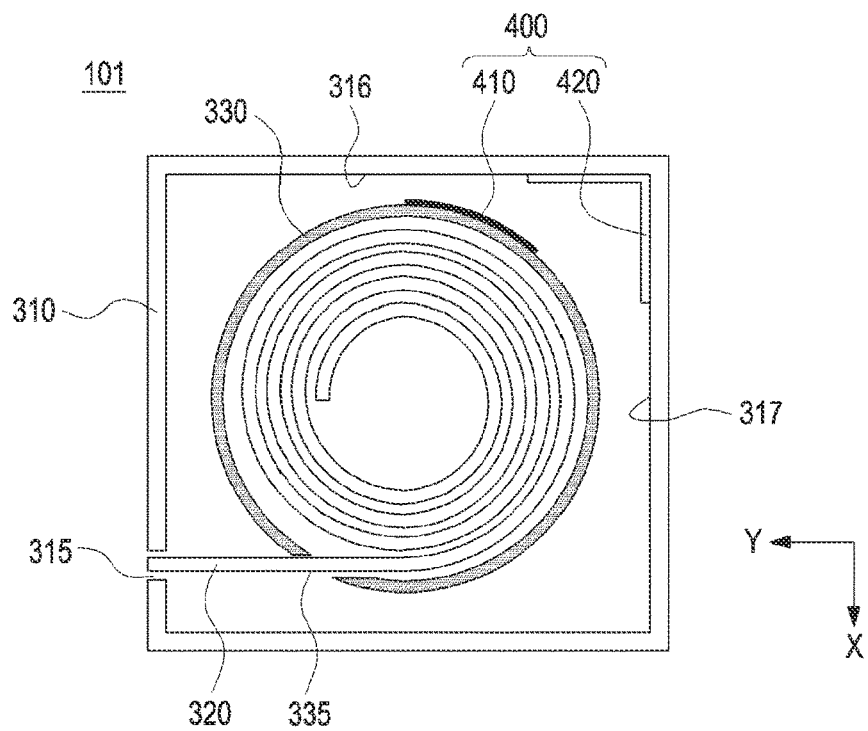
FIG. 5 is a projection view seen from one side of an electronic device according to various embodiments.

FIG. 5 is a projection view seen from one side of an electronic device according to various embodiments.

Figure 6:
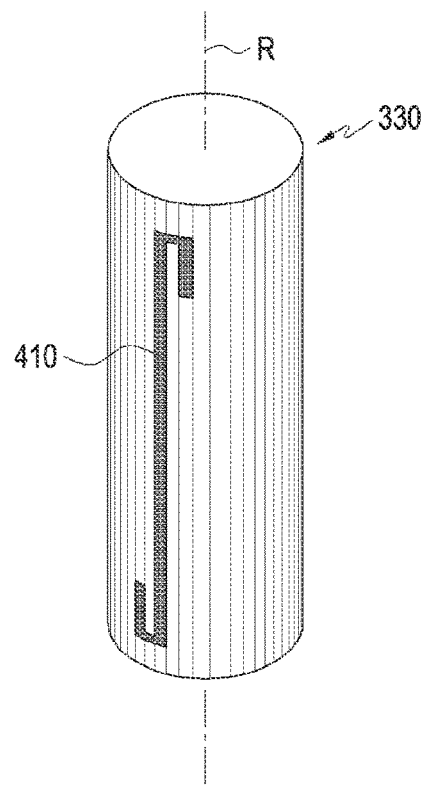
FIG. 6 is a perspective view illustrating an external structure of a shielding case and an antenna structure according to various embodiments.

FIG. 6 is a perspective view illustrating an external structure of a shielding case, and an example antenna structure according to various embodiments.

Figure 7:
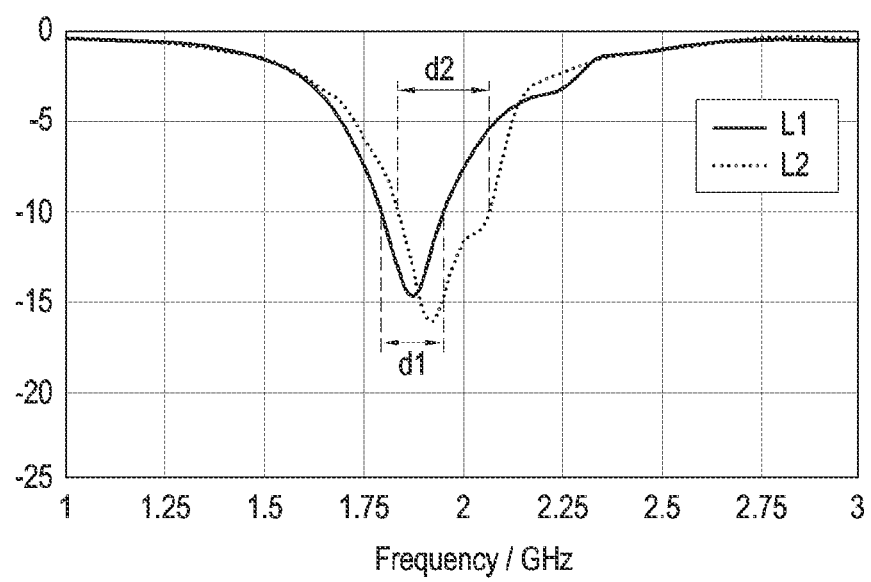
FIG. 7 is a graph illustrating resonant properties of an antenna structure in an electronic device according to various embodiments.

FIG. 7 is a graph illustrating resonant properties of an antenna structure in an electronic device according to various embodiments.

According to various embodiments, the electronic device (e.g., the electronic device 101 of FIGS. 1 to 4) may include the housing 310, the rollable display 320 accommodated inside the housing 310 or exposed to the outside of the housing 310 through the second opening 315 of the housing 310, the shielding case 330 formed to surround the rollable display 320, and an antenna structure (e.g., the first antenna structure 410, and/or the second antenna structure 420) disposed in (or adjacent to) an area of the housing 310 and/or the shielding case 330.

The configurations of the housing 310, the rollable display 320, the shielding case 330, and the antenna structure 400 of FIGS. 5 and 6 may be wholly or partially identical or similar to those of the housing 310, the rollable display 320, the shielding case 330, and the antenna structure 400 of FIGS. 2, 3 and 4.

According to various embodiments, the housing 310 may accommodate various electric and electronic components, and provide, for example, a space in which the rollable display 320 and/or the shielding case 330 is accommodated. The second opening 315 of the housing 310 may provide a path through which the rollable display 320 is accommodated or withdrawn.

According to various embodiments, the shielding case 330 may be formed to surround at least a part of the rollable display 320 so that the rollable display 320 does not affect (e.g., does not cause interference to) the antenna structure 400. The first opening 335 may be disposed on one surface (e.g., the rear case 330b of FIG. 2) of the shielding case 330, facing the second opening 315, for accommodating or withdrawing the rollable display 320 therethrough.

According to various embodiments, the antenna structure 400 may include the first antenna structure 410 and the second antenna structure 420.

According to an embodiment, the second antenna structure 420 may be designed to include a conductive part and located closer to the housing 310 between the housing 310 and the shielding case 330. For example, the second antenna structure 420 may be disposed along the inner surface of the housing 310.

According to an embodiment, the second antenna structure 420 may be designed to be adjacent to a corner area of the housing 310. For example, the second antenna structure 420 may be disposed across a first inner surface 316 of the housing 310 facing a first direction (the X-axis direction) and a second inner surface 317 of the housing 310 facing a second direction (the X-axis direction) different from the first direction (the X-axis direction). The first direction (the X-axis direction) and the second direction (the X-axis direction) may be perpendicular to each other.

According to an embodiment, the second antenna structure 420 may be located far from the first opening 335 (or the second opening 315), for slide-in/slide-out of the rollable display 320. For example, as the first opening 335 (or the second opening 315) is located opposite to the second antenna structure 420 with respect to the shielding case (or the housing 310), an effect (e.g., interference) between the display 320 and the second antenna structure 420 may be limited.

According to an embodiment, the second antenna structure 420 may be disposed apart from the second opening 315 of the housing 310, with the shielding case 330 interposed in between. As the shielding case 330 is located between the second antenna structure 420 and the rollable display 320, an effect (e.g., interference) between the rollable display 320 and the second antenna structure 420 may be reduced.

According to an embodiment, the first antenna structure 410 may be designed to include a conductive part and located closer to the shielding case 330 between the housing 310 and the shielding case 330. For example, the first antenna structure 410 may be disposed along the outer surface of the shielding case 330.

According to an embodiment, at least a part of the first antenna structure 410 may be disposed to face the second antenna structure 420 disposed along the inner surface of the housing 310. At least a part of the first antenna structure 410 may be disposed apart from the second antenna structure 420.

According to an embodiment, the first antenna structure 410 may be disposed along the length direction of the shielding case 330. For example, the shielding case 330 may be shaped into a cylinder centered on the rotation axis R, and the first antenna structure 410 may be shaped into a conductive plate, with at least a part thereof formed along the rotation axis R.

According to an embodiment, the first antenna structure 410 may be located far from the first opening 335 (or the second opening 315), for slide-in/slide-out of the rollable display 320. For example, as the first opening 335 (or the second opening 315) is located opposite to the first antenna structure 410 with respect to the shielding case (or the housing 310), an effect (e.g., interference) between the display 320 and the first antenna structure 410 may be limited.

According to an embodiment, the first antenna structure 410 may be disposed apart from the second opening 315 of the housing 310, with the shielding case 330 interposed therebetween. As the shielding case 330 is located between the second antenna structure 420 and the rollable display 320, an effect (e.g., interference) between the rollable display 320 and the second antenna structure 420 may be reduced.

Referring to FIG. 7, a graph illustrating resonant properties in the case of a single antenna structure 400 and in the case of two antenna structures 400 is shown. L1 represents an S parameter plot, when only the second antenna structure 420 (or the first antenna structure 410) is designed, whereas L2 represents an S parameter plot, when the first antenna structure 410 and the second antenna structure 420 are designed.

According to various embodiments, compared to the case L1 in which only the second antenna structure 420 (or the first antenna structure 410) is designed, it may be noted that when the first antenna structure 410 and the second antenna structure 420 are designed (L2), radiation characteristics are provided in a relatively wide frequency band. For example, it may be noted that at approximately −10 dB, a second frequency band range d2 is relatively extended, compared to a first frequency band range d1. According to an embodiment, the electronic device 101 according to the disclosure may provide advantageous radiation performance by dividing an antenna frequency range into a plurality of antenna frequency ranges through modification to an antenna design, in addition to the method of extending the band of the antenna frequency range.

Figure 8A:
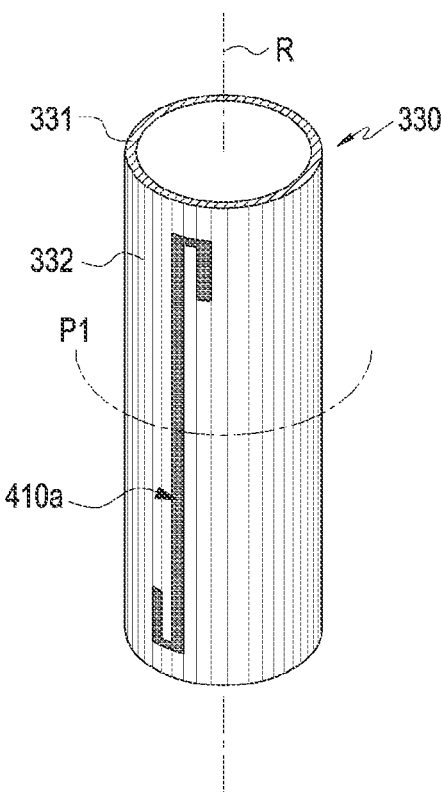
FIGS. 8A, 8B and 8C are perspective views illustrating examples of a first antenna structure disposed on the outer surface of a shielding case according to various embodiments.
Figure 8B:
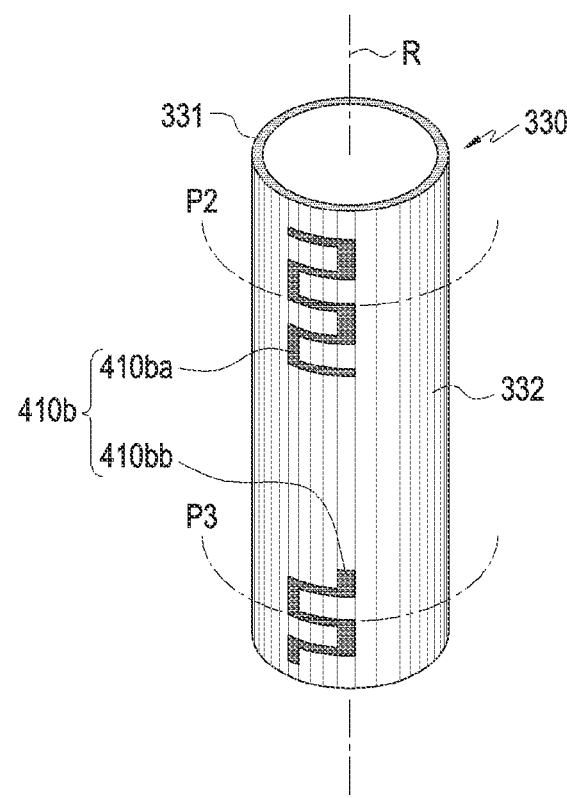
Figure 8C:
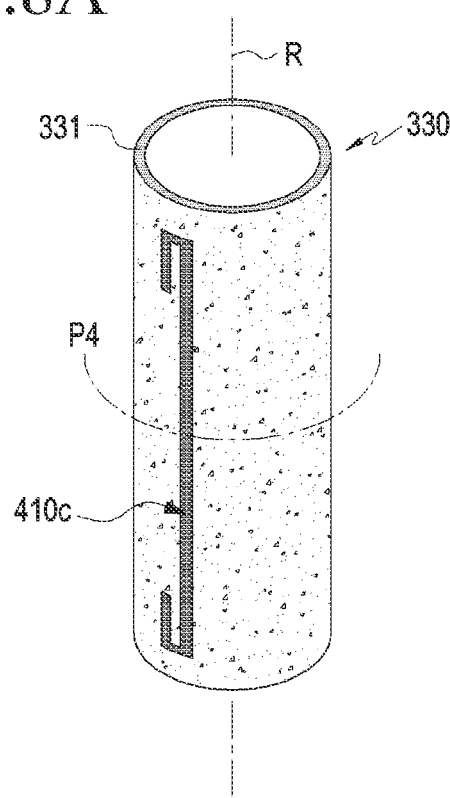

FIGS. 8A, 8B and 8C are diagrams illustrating example first antenna structures disposed on the outer surface of a shielding case according to various embodiments.

According to various embodiments, an electronic device (e.g., the electronic device 101 of FIGS. 1 to 4) may include a housing (e.g., the housing 310 of FIGS. 2 to 4), a rollable display (e.g., the rollable display 320 of FIGS. 2 to 4), the shielding case 330 formed to surround the rollable display 320, and an antenna structure (e.g., a $(1-1)^{th}$ antenna structure 410a, a $(1-2)^{th}$ antenna structure 410b, and a $(1-3)^{th}$ antenna structure 410c) disposed on (or adjacent to) one area of the shielding case 330.

The configurations of the shielding case 330 and the first antenna structure (e.g., the $(1-1)^{th}$ antenna structure 410a, the $(1-2)^{th}$ antenna structure 410b, and the $(1-3)^{th}$ antenna structure 410c) illustrated in FIGS. 8A, 8B, and 8C may be wholly or partially identical or similar to those of the shielding case 330 and the first antenna structure 410 illustrated in FIGS. 5 and 6.

According to various embodiments, first antenna structures (e.g., the $(1-1)^{th}$ antenna structure 410a, the $(1-2)^{th}$ antenna structure 410b, and the $(1-3)^{th}$ antenna structure 410c) may be disposed on the outer surface of the shielding case 330.

Referring to FIGS. 8A and 8B, the shielding case 330 may include a cylindrical structure formed of a conductive material (e.g., a conductive structure 331) and a dielectric layer 332 disposed to surround the outer surface of the conductive structure 331 and formed of a non-conductive material. For example, the dielectric layer 332 may be fabricated to coat the outer surface of conductive structure 331.

According to an embodiment, each of the $(1-1)^{th}$ antenna structure 410a and the $(1-2)^{th}$ antenna structure 410b may be designed by a part (e.g., a slot part) from which an area of the dielectric layer 332 has been removed and the conductive structure 331 exposed by the part. For example, each of the $(1-1)^{th}$ antenna structure 410a and the $(1-2)^{th}$ antenna structure 410b may be designed in the shape of a specified slot to provide an antenna in a desired frequency band. To this end, one area of the dielectric layer 332 may be removed (e.g., cut) in the shape of the specified slot, and the conductive part 331 exposed in a shape corresponding to the specified slot may serve as an antenna.

According to an embodiment (e.g., see FIG. 8A), the $(1-1)^{th}$ antenna structure 410a may be designed to expose outward the conductive part 331 which is symmetrical vertically or horizontally with respect to a virtual center line (e.g., a first axis P1) perpendicular to the rotation axis R. For example, the specified slot for the conductive part 331 may be an opening, and may be a structure including a part bent at one end thereof. In another example, the end of the specified slot may be shaped into '⊔' or '⊓'. However, the design of the specified slot may be modified in various other structures which are symmetrical with respect to the first axis P1 and provide a designer-intended frequency band, in addition to the disclosed configuration.

According to an embodiment (e.g., see FIG. 8B), the $(1-2)^{th}$ antenna structure 410b may include a $(1-2a)^{th}$ antenna structure 410ba and a $(1-2b)^{th}$ antenna structure 410bb spaced apart from each other. Each of the $(1-2a)^{th}$ antenna structure 410ba and the $(1-2b)^{th}$ antenna structure 410bb may be designed such that a conductive part symmetrical vertically and horizontally with respect to a virtual center line (e.g., a second axis P2 or a third axis P3) is exposed outward. For example, a specified slot for the conductive parts 331 may be an opening, and may be a structure including a part bent at one end thereof. In another example, the end of the specified slot may be shaped into '⊏' or '⊐'. The design of the $(1-2a)^{th}$ antenna structure 410ba and the $(1-2b)^{th}$ antenna structure 410bb may be modified in various other structures which are symmetrical with respect to the second axis P2 and the third axis P3 and provide designer-intended frequency bands, in addition to the disclosed configurations.

Referring to FIG. 8C, the shielding case 330 may be designed in a cylindrical structure (e.g., the conductive structure 331) formed of a conductive material. According to an embodiment, a $(1-3)^{th}$ antenna structure 410c may include a slot part (e.g., a specified slot shape) in which a part of the conductive structure 331 is opened. For example, the $(1-3)^{th}$ antenna structure 410c may include an area of the conductive structure 331 and a slot part formed to be surrounded by the conductive structure 331.

According to an embodiment, the $(1-3)^{th}$ antenna structures 410c may be designed in the shape of a specified slot that is symmetrical vertically or horizontally with respect to a virtual center line (e.g., a fourth axis P4) perpendicular to the rotation axis R. The specified slot may be an opening and have a structure including a bent part at one end thereof. In another example, the end of the specified slot may be shaped into '⊔' or '⊓'. However, the specified slot may be a recessed structure or a shape in which an area is opened and another area is stepped, not limited to the opening structure. Besides, the $(1-3)^{th}$ antenna structure 410c may be modified in various other structures which are symmetrical with respect to the fourth axis P4 and provide a designer-intended frequency band.

Figure 9A:
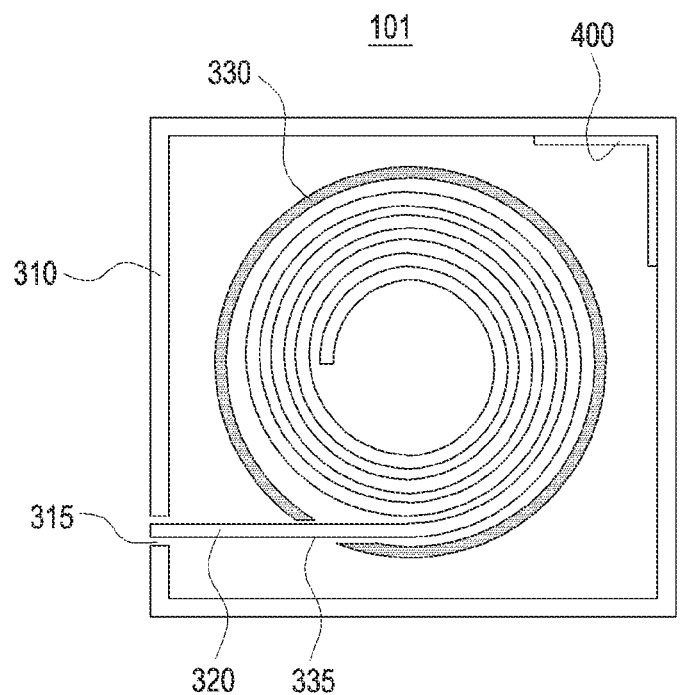
FIG. 9A is a projection view illustrating a side surface of an electronic device in a slide-in state of a display according to various embodiments.
Figure 9B:
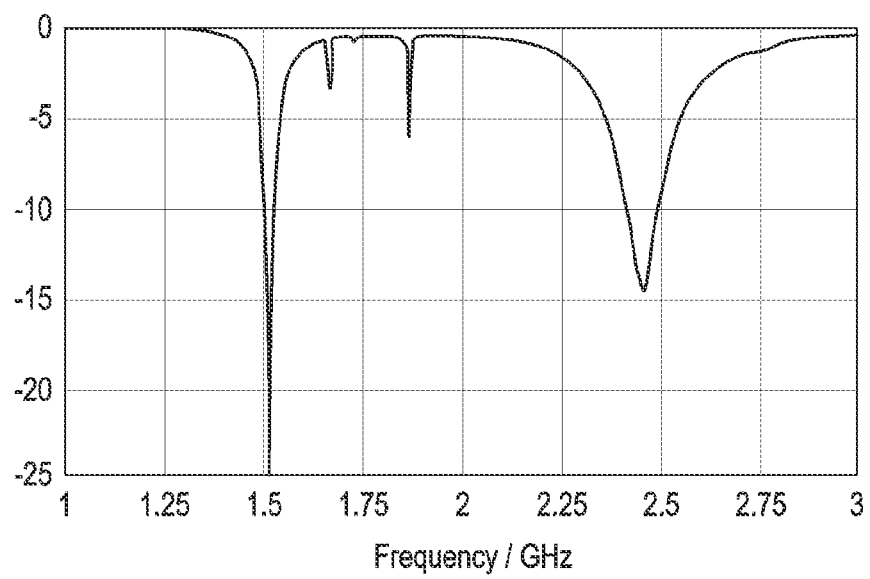
FIG. 9B is a graph illustrating resonant properties of an antenna structure illustrated in FIG. 9A according to various embodiments.

FIG. 9A is a projection view illustrating a side surface of an electronic device in a slide-in state of a display according to various embodiments. FIG. 9B is a graph illustrating resonant properties of an antenna structure illustrated in FIG. 9A according to various embodiments.

Figure 10A:
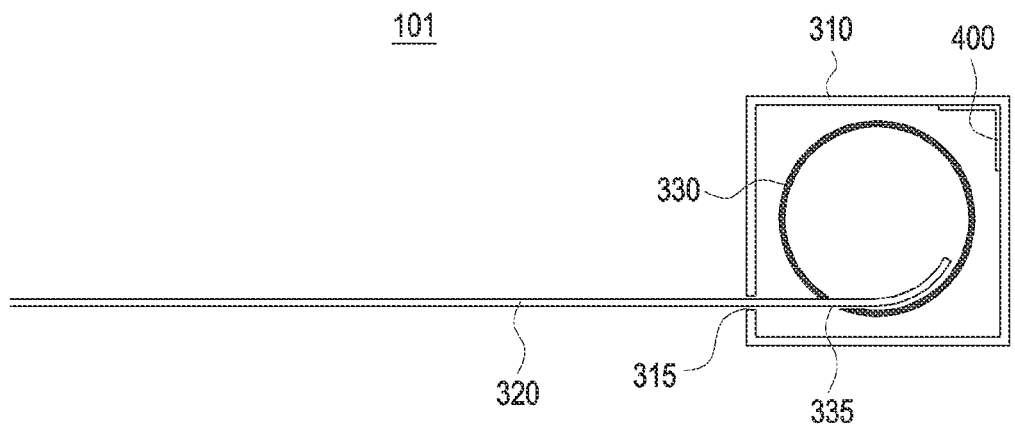
FIG. 10A is a projection view illustrating a side surface of an electronic device in a slide-out state of a display according to various embodiments.
Figure 10B:
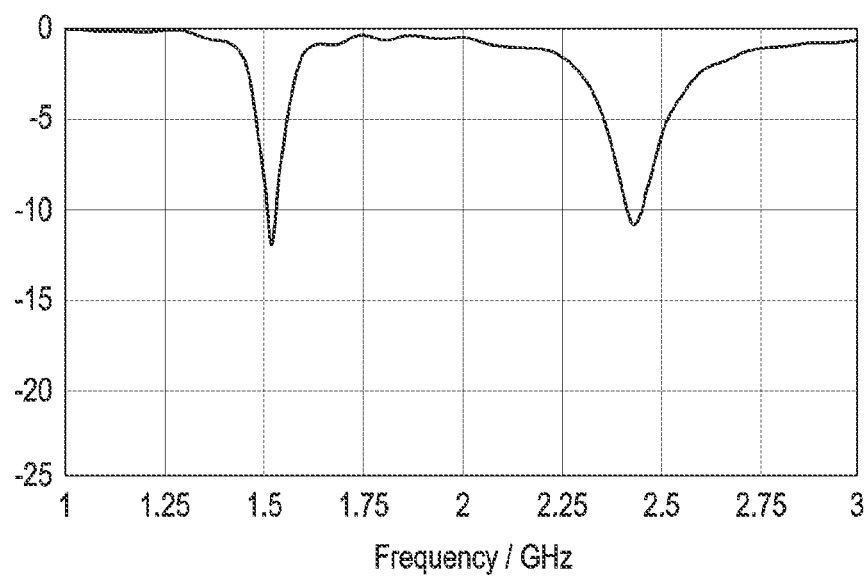
FIG. 10B is a graph illustrating resonant properties of an antenna structure illustrated in FIG. 10A according to various embodiments.

FIG. 10A is a projection view illustrating a side surface of an electronic device in a slide-out state of a display according to various embodiments. FIG. 10B is a graph illustrating resonant properties of an antenna structure illustrated in FIG. 10A according to various embodiments.

According to various embodiments, an electronic device (e.g., the electronic device 101 of FIGS. 1 to 4) may include a housing (e.g., the housing 310 of FIGS. 2 to 4), the rollable display 320 which may be accommodated inside the housing 310 or exposed from the housing 310 through the second opening 315 of the housing 310, the shielding case 330 formed to surround the rollable display 320, and the antenna structure 410 disposed in (or adjacent to) one area of the housing 310 and/or the shielding case 330.

The configurations of the housing 310, the rollable display 320, the shielding case 330, and the antenna structure 400 of FIGS. 9A, 9B, 10A, and 10B may be wholly or partially identical or similar to those of the housing 310, the rollable display 320, the shielding case 330, and the antenna structure 400 of FIGS. 5 and 6. The antenna structure 400 to be described may be at least one of the first antenna structure 410 or the second antenna structure 420 illustrated in FIGS. 5 and 6.

According to various embodiments, as the rollable display 320 slides in or out with respect to the housing 310, the electronic device 101 may be placed in a closed state or an open state. According to an embodiment, one end of the rollable display 320 may be coupled to a roller (e.g., the battery 370) disposed inside the housing 310, and the other area of the rollable display 320 except for the one end may be changed to be rolled or extended.

According to various embodiments, the shielding case 330 may be disposed inside the housing 310, to surround the rollable display 320 and limit interference with the antenna structure 400. The antenna structure 400 may be formed in a partial area of the housing 310 (or a partial area of the shielding case 330). The antenna structure 400 may be designed to include a conductive material and disposed apart from the first opening 335 (or the second opening 315) not to face the first opening 335 (or the second opening 315) for slide-in/out of the rollable display 320.

Referring to FIGS. 9B and 10B, antenna resonant properties in the slide-in state and slide-out state of the rollable display 320 are shown. As the rollable display 320 is disposed electromagnetically separate from the antenna structure 400 through the shielding case 330, the electronic device 101 according to the disclosure may prevent and/or reduce the influence (e.g., interference) of the rollable display 320 on the antenna structure 400. Accordingly, in the slide-in state and the slide-out state of the rollable display 320, an antenna frequency generated by the antenna structure may provide similar resonant properties regardless of the distance between the rollable display 320 and the antenna structure 400.

Referring to the graph of FIG. 9B, an S parameter plot in the slide-in state of the rollable display 320 is illustrated. As noted, a value of −6 dB or less is provided at approximately 1.3 GHz to 1.6 GHz and at approximately 2.3 GHz to 2.6 GHz, thus providing advantageous antenna radiation characteristics.

Referring to the graph of FIG. 10B, an S parameter plot in the slide-out state of the rollable display 320 is illustrated. As noted, a value of −6 dB or less is provided at approximately 1.3 GHz to 1.6 GHz and at approximately 2.3 GHz to 2.5 GHz, thus providing advantageous antenna radiation characteristics.

Figure 11:
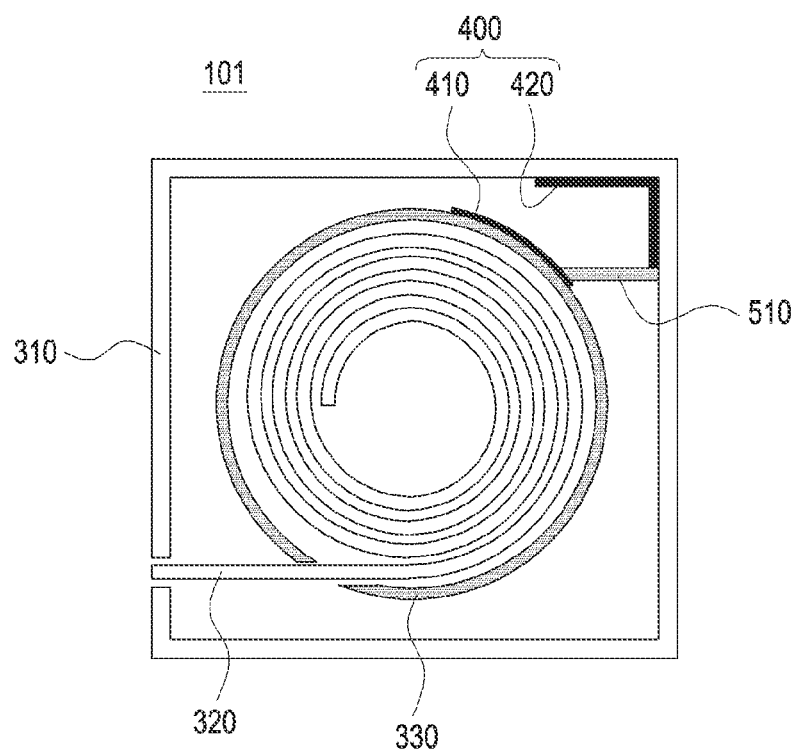
FIG. 11 is a projection view illustrating example antenna structures in an electronic device according to various embodiments.

FIG. 11 is a projection diagram illustrating example antenna structures in an electronic device according to various embodiments.

According to various embodiments, an electronic device (e.g., the electronic device 101 of FIGS. 1 to 4) may include the housing 310, the rollable display 320, the shielding case 330, and an antenna structure (e.g., the first antenna structure 410, and/or the second antenna structure 420).

The configurations of the housing 310, the rollable display 320, the shielding case 330, and the first antenna and second structures 410 and 420 of FIG. 11 may be wholly or partially identical to those of the housing 310, the rollable display 320, the shielding case 330, and the first and second antenna structures 410 and 420 of FIGS. 5 and 6.

A coupling (or connecting) configuration between the first antenna structure 410 and the second antenna structure 420 different from that of FIGS. 5 and 6 will be described.

According to various embodiments, the second antenna structure 420 may be designed to include a conductive part and located closer to the housing 310 between the housing 310 and the shielding case 330. For example, the second antenna structure 420 may be disposed along the inner surface of the housing 310.

According to various embodiments, the first antenna structure 410 may be designed to include a conductive part and located closer to the shielding case 330 between the housing 310 and the shielding case 330. For example, the first antenna structure 410 may be disposed along the outer surface of the shielding case 330. According to an embodiment, the second antenna structure 420 may operate as a main antenna for communication with the outside, and the first antenna structure 410 may be designed in an auxiliary pattern serving as a sub-antenna of the second antenna structure 420.

According to various embodiments, the first antenna structure 410 and the second antenna structure 420 may be directly or indirectly coupled (or connected) to each other. A first antenna bridge 510 may be disposed between the first antenna structure 410 and the second antenna structure 420 and have one end directly contacting a part of the first antenna structure 410 and the other end directly contacting a part of the second antenna structure 420. The first antenna bridge 510 may include a conductive material and may be designed in various structures for electrically coupling (or connecting) the first antenna structure 410 to the second antenna structure 420. As the electronic device 101 according to the present disclosure directly couples (or connects) the first antenna structure 410 and the second antenna structure 420 to each other by the first antenna bridge 510, impedance matching and/or antenna radiation characteristics may be improved for any designer-intended frequency band.

Figure 12:
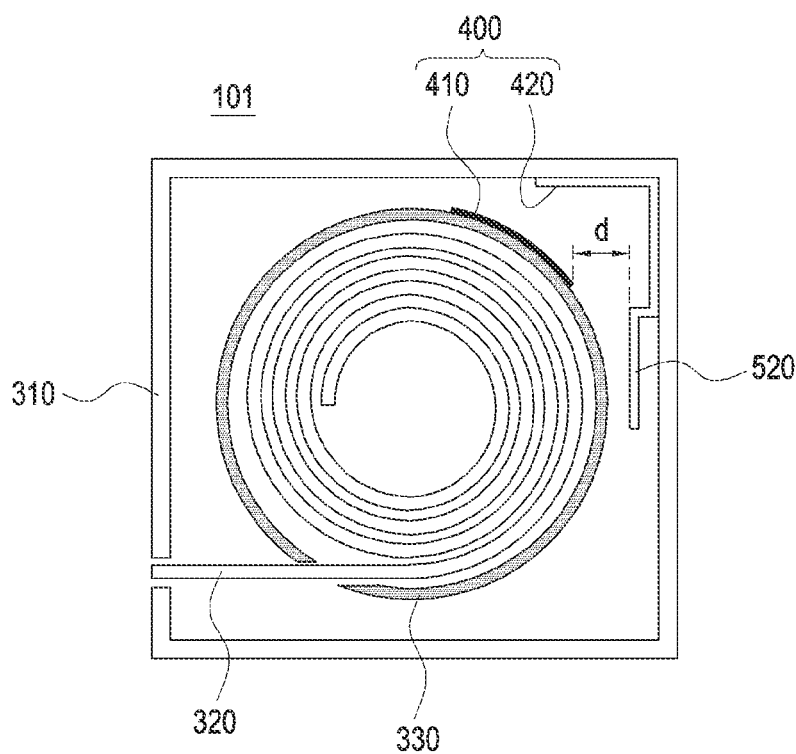
FIG. 12 is a projection view illustrating example antenna structures in an electronic device according to various embodiments.

FIG. 12 is a projection view illustrating example antenna structures in an electronic device according to various embodiments.

Figure 13:
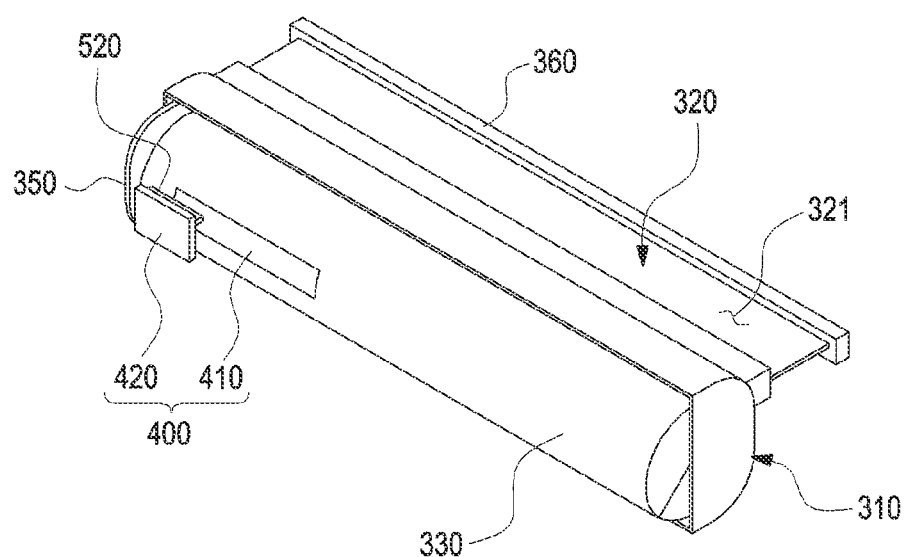
FIG. 13 is a perspective view illustrating an electronic device shown without a part of a housing to show antenna structures in the electronic device according to various embodiments.

FIG. 13 is a perspective view illustrating an electronic device except for a part of a housing to show antenna structures of the electronic device according to various embodiments.

According to various embodiments, an electronic device (e.g., the electronic device 101 of FIGS. 1 to 4) may include the housing 310, the rollable display 320, the shielding case 330, and an antenna structure (e.g., the first antenna structure 410 and/or the second antenna structure 420).

The configurations of the housing 310, the rollable display 320, the shielding case 330, and the first antenna and second structures 410 and 420 of FIGS. 12 and 13 may be wholly or partially identical to those of the housing 310, the rollable display 320, the shielding case 330, and the first and second antenna structures 410 and 420 of FIGS. 5 and 6.

A coupling (or connecting) configuration between the first antenna structure 410 and the second antenna structure 420 different from that of FIGS. 5 and 6 will be described below.

According to various embodiments, the second antenna structure 420 may be designed to include a conductive part and located closer to the housing 310 between the housing 310 and the shielding case 330. For example, the second antenna structure 420 may be disposed along the inner surface of the housing 310.

According to various embodiments, the first antenna structure 410 may be designed to include a conductive part and located closer to the shielding case 330 between the housing 310 and the shielding case 330. For example, the first antenna structure 410 may be disposed along the outer surface of the shielding case 330. According to an embodiment, the second antenna structure 420 may operate as a main antenna for communication with the outside, and the first antenna structure 410 may be designed in an auxiliary pattern serving as a sub-antenna of the second antenna structure 420.

According to various embodiments, the first antenna structure 410 and the second antenna structure 420 may be directly or indirectly coupled (or connected) to each other. A second antenna bridge 520 may be disposed between the first antenna structure 410 and the second antenna structure 420, and have one end extending from a part of the second antenna structure 420 and the other end apart from a part of the first antenna structure 410. For example, as the other end of the second antenna bridge 520 is disposed apart from the first antenna structure 410 by a specified distance d, the second antenna bridge 520 may be coupled to the first antenna structure 410 in a non-contact coupling (or connecting) manner. The second antenna bridge 520 may include a conductive material and may be designed in various structures for electrically coupling (or connecting) the first antenna structure 410 to the second antenna structure 420. As the electronic device 101 according to the present disclosure directly couples the first antenna structure 410 and the second antenna structure 420 to each other by the second antenna bridge 520, impedance matching and/or antenna radiation characteristics may be improved for any designer-intended frequency band.

According to various example embodiments of the disclosure, an electronic device (e.g., the electronic device 101 of FIGS. 1 to 4) may include a housing (e.g., the housing 310 of FIG. 4), a rollable display (e.g., the rollable display 320 of FIG. 4), a shielding case (e.g., the shielding case 330 of FIG. 4) disposed inside the housing and surrounding at least a part of the rollable display, and including a first opening formed therein to accommodate movement of the rollable display, and a first antenna structure (e.g., the first antenna structure 410 of FIG. 4) including at least one antenna disposed in an area outside the shielding case.

According to various example embodiments, the electronic device may further include a second antenna structure (e.g., the antenna structure 420 of FIG. 4) including at least one antenna disposed in an area inside the housing, and at least a part of the second antenna structure may be disposed to face the first antenna structure.

According to various example embodiments, the electronic device may further include an antenna bridge (e.g., the antenna bridge 510 or 520 of FIG. 11 or FIG. 13) disposed between the housing and the shielding case and electrically coupling or connecting the first antenna structure and the second antenna structure to each other.

According to various example embodiments, one end of the antenna bridge may be directly coupled or connected to a part of the second antenna structure, and the other end of the antenna bridge may be directly coupled or connected to a part of the first antenna structure.

According to various example embodiments, one end of the antenna bridge may be directly coupled or connected to a part of the second antenna structure, and the other end of the antenna bridge may be disposed apart from a part of the first antenna structure by a specified distance and coupled or connected to the part of the first antenna structure.

According to various example embodiments, the electronic device may further include a battery (e.g., the battery 370 of FIG. 4) disposed inside the shielding case and configured to allow the rollable display to be wound therearound.

According to various example embodiments, the housing may include a second opening through which the rollable display is accommodated into the housing or withdrawn from the housing, and the first opening of the shielding case may be disposed in parallel to the second opening.

According to various example embodiments, the shielding case may be provided in a cylindrical shape, and the first antenna structure may be located opposite the first opening with respect to an outer surface of the shielding case.

According to various example embodiments, a first resonant property of the first antenna structure or the second antenna structure in a slide-in state of the rollable display into the housing may be similar to a second resonant property of the first antenna structure or the second antenna structure in a slide-out state of the rollable display from the housing.

According to various example embodiments, the shielding case may be include a conductive material configured to limit an electromagnetic effect between the first antenna structure and the rollable display.

According to various example embodiments, an antenna frequency band range provided by electrical coupling between the first antenna structure and the second antenna structure may be larger than an antenna frequency band range provided by the first antenna structure or the second antenna structure.

According to various example embodiments, the shielding case may include: a cylindrical conductive structure comprising a conductive material (e.g., the conductive structure 331 of FIG. 8A) and a dielectric layer (e.g., the dielectric layer 332 of FIG. 8A) disposed to surround an outer surface of the conductive structure and comprising a non-conductive material. The first antenna structure may include a first part and a second part symmetrical horizontally or vertically with respect to a first axis perpendicular to a rotation axis of the rollable display.

According to various example embodiments, the first antenna structure may include a part from which an area of the dielectric layer is removed and a conductive structure exposed by the part.

According to various example embodiments, the shielding case may include a cylindrical conductive part comprising a conductive material, and the first antenna structure may include an area of the conductive structure and a slot part surrounded by the conductive part.

According to various example embodiments, the electronic device may further include a circuit board (e.g., the printed circuit board 350 of FIG. 4) disposed between the housing and the shielding case and on which a communication circuit electrically coupled to the first antenna structure or the second antenna structure is mounted.

According to various example embodiments of the disclosure, an electronic device (e.g., the electronic device 101 of FIGS. 1 to 4) may include: a housing (e.g., the housing 310 of FIG. 4), a rollable display (e.g., the rollable display 320 of FIG. 4), a shielding case (e.g., the shielding case 330 of FIG. 4) disposed inside the housing and surrounding at least a part of the rollable display, a first antenna structure (e.g., the first antenna structure 410 of FIG. 4) including at least one antenna disposed in an area outside the shielding case, and a second antenna structure (e.g., the antenna structure 420 of FIG. 4) including at least one antenna disposed in an area inside the housing and at least partially facing the first antenna structure.

According to various example embodiments, the electronic device may further include an antenna bridge (e.g., the antenna bridge 510 or 520 of FIG. 11 or 13) disposed between the housing and the shielding case and electrically coupling the first antenna structure to the second antenna structure.

According to various example embodiments, the shielding case may include a conductive material configured to limit interference between the first antenna structure and the rollable display.

According to various example embodiments, a first resonant property of the second antenna structure in a slide-in state of the rollable display into the housing may be similar to a second resonant property of the second antenna structure in a slide-out state of the rollable display from the housing.

According to various example embodiments of the disclosure, the first antenna structure may have a pattern including a slot part.

The antenna structure and the electronic device including the same described above according to various embodiments of the disclosure are not limited by the foregoing embodiments and the drawings, and it will be apparent to those skilled in the art that many replacements, modifications, and variations can be made within the technical scope of the disclosure.

What is claimed is:

1. An electronic device comprising:
   a housing;
   a rollable display;
   a shielding case disposed inside the housing and surrounding at least a part of the rollable display, and including a first opening to accommodate movement of the rollable display; and
   a first antenna structure including at least one antenna disposed in an area outside the shielding case.

2. The electronic device of claim 1, further comprising a second antenna structure including at least one antenna disposed in an area inside the housing,
   wherein at least a part of the second antenna structure is disposed to face the first antenna structure.

3. The electronic device of claim 2, further comprising an antenna bridge disposed between the housing and the shielding case and electrically coupling or connecting the first antenna structure and the second antenna structure to each other.

4. The electronic device of claim 3, wherein one end of the antenna bridge is directly coupled or connected to a part of the second antenna structure, and another end of the antenna bridge is directly coupled or connected to a part of the first antenna structure.

5. The electronic device of claim 3, wherein one end of the antenna bridge is directly coupled or connected to a part of the second antenna structure, and another end of the antenna bridge is disposed apart from a part of the first antenna structure by a specified distance and coupled or connected to the part of the first antenna structure.

6. The electronic device of claim 1, further comprising a battery disposed inside the shielding case and configured to allow the rollable display to be wound around the battery.

7. The electronic device of claim 1, wherein the housing includes a second opening through which the rollable display is accommodated into the housing or withdrawn from the housing, and
   wherein the first opening of the shielding case is disposed in parallel to the second opening.

8. The electronic device of claim 7, wherein the shielding case has a substantially cylindrical shape, and
   wherein the first antenna structure is located opposite the first opening with respect to an outer surface of the shielding case.

9. The electronic device of claim 2, wherein a first resonant property of the first antenna structure or the second antenna structure in a slide-in state of the rollable display is similar to a second resonant property of the first antenna structure or the second antenna structure in a slide-out state of the rollable display.

10. The electronic device of claim 1, wherein the shielding case comprises a conductive material configured to limit an electromagnetic effect between the first antenna structure and the rollable display.

11. The electronic device of claim 2, wherein an antenna frequency band range provided by electrical coupling between the first antenna structure and the second antenna structure is larger than an antenna frequency band range provided by the first antenna structure or the second antenna structure.

12. The electronic device of claim 1, wherein the shielding case includes a cylindrical conductive structure comprising a conductive material and a dielectric layer disposed to surround an outer surface of the conductive structure and comprising a non-conductive material, and
   wherein the first antenna structure includes a first part and a second part symmetrical horizontally or vertically with respect to a first axis perpendicular to a rotation axis of the rollable display.

13. The electronic device of claim 12, wherein the first antenna structure includes a part from which an area of the dielectric layer of the shielding case is removed and a conductive structure is exposed.

14. The electronic device of claim 1, wherein the shielding case includes a cylindrical conductive part comprising a conductive material, and
   wherein the first antenna structure includes an area of the conductive structure and a slot part surrounded by the conductive part.

15. The electronic device of claim 2, further comprising a circuit board disposed between the housing and the shielding case and on which a communication circuit electrically coupled to the first antenna structure or the second antenna structure is mounted.

* * * * *